United States Patent

[11] 3,588,425

| | | |
|---|---|---|
| [72] | Inventor | **Keith O. Erickson** **White Bear Lake, Minn.** |
| [21] | Appl. No. | **839,020** |
| [22] | Filed | **July 3, 1969** |
| [45] | Patented | **June 28, 1971** |
| [73] | Assignee | **Control Data Corporation** **Minneapolis, Minn.** |

[54] DUAL SOURCE RADIATION BONDING OF PLURAL JOINTS
4 Claims, 4 Drawing Figs.

[52] U.S. Cl. .......... 219/85, 29/471.1, 219/347
[51] Int. Cl. .......... B23k 1/04
[50] Field of Search .......... 219/85, 347, 349, 354, 405, 411; 29/471.1

[56] References Cited

UNITED STATES PATENTS

| | | | |
|---|---|---|---|
| 2,434,166 | 1/1948 | Klumpp | 219/349X |
| 2,504,110 | 4/1950 | Davis et al. | 219/349X |
| 3,205,572 | 9/1965 | Jochems | 219/85X |
| 3,230,338 | 1/1966 | Kawecki | 219/85 |
| 3,283,124 | 11/1966 | Kawecki | 219/85 |
| 3,292,418 | 12/1966 | Oehme et al. | 219/349UX |
| 3,304,406 | 2/1967 | King | 219/349UX |
| 3,382,342 | 5/1968 | Dix et al. | 219/85 |

*Primary Examiner*—J. V. Truhe
*Assistant Examiner*—L. A. Schutzman
*Attorney*—Paul L. Sjoquist

ABSTRACT: A manufacturing method and apparatus for soldering the leads of integrated circuit flat packs to the contact pads of printed circuit boards. A pair of infrared lamps, focused by cylindroidal reflectors on both sides of the circuit boards are used to supply heat. Each circuit board may contain contact pads of widely varying heat sink characteristics. Addition of the second lamp as a heat source allows wide usage of the system because all possible heat requirements can be satisfied without the risks of high heat concentrations which may damage components and circuit boards.

Figure 1:
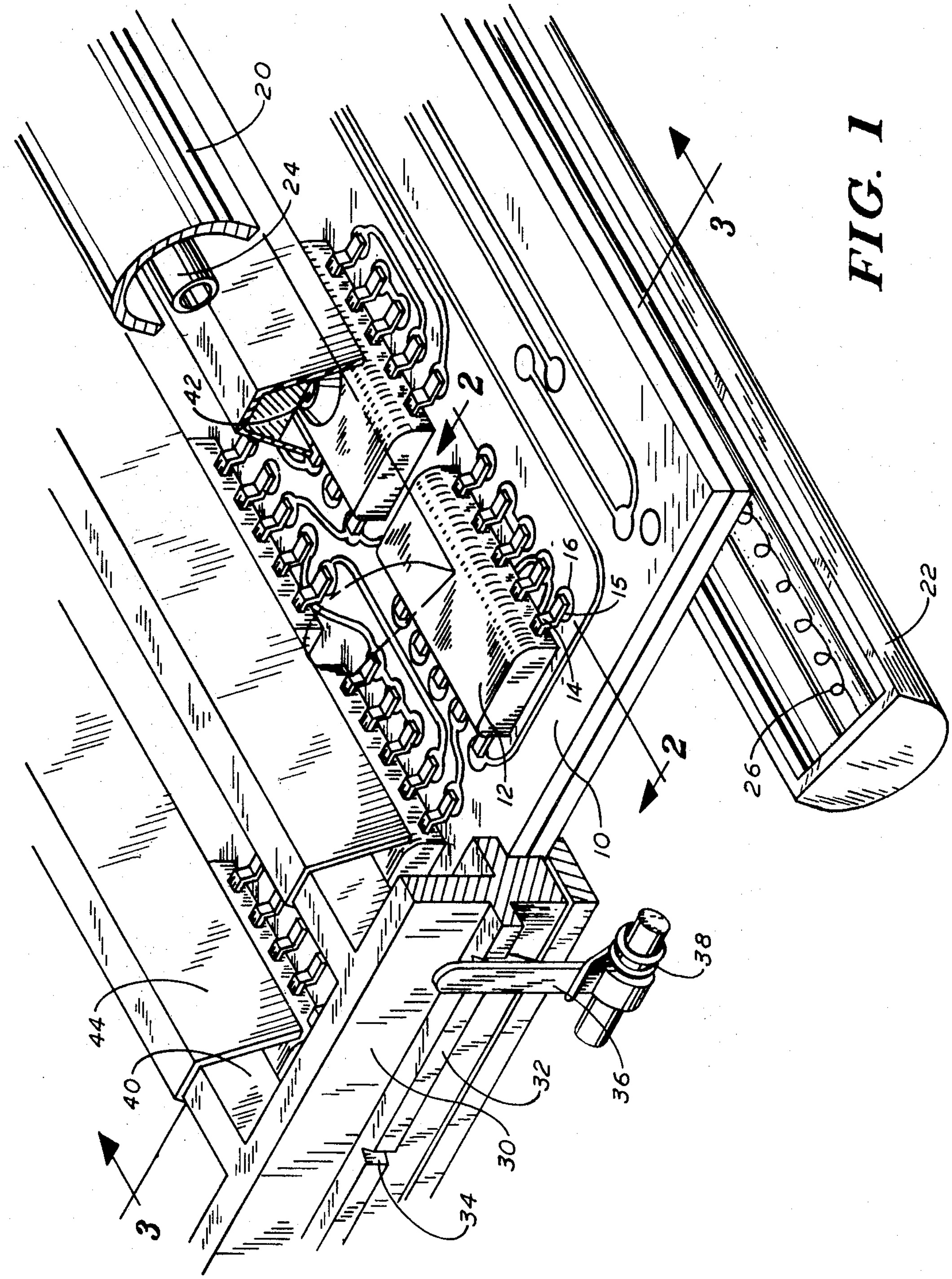

INVENTOR
KEITH O. ERICKSON
BY Paul L. Sjoquist
AGENT

INVENTOR
KEITH O. ERICKSON
BY Paul L. Sjoquist
AGENT

INVENTOR
KEITH O. ERICKSON
BY Paul L. Sjoquist
AGENT

DUAL SOURCE RADIATION BONDING OF PLURAL JOINTS

BACKGROUND OF THE INVENTION

1. Field of the Invention

This invention relates to a method for mounting electrical devices on planiform insulators (e.g., printed circuit boards), thus making an electrical circuit by a thermomechanical manufacturing process.

2. Description of the Prior Art

Many methods of soldering electrical components have been devised. These have sometimes reached a high degree of expertize. However, such packages as the integrated circuit flat pack have caused difficult production, problems due to factors such as thermal sensitivity. Therefore, the soldering of integrated circuits and other sophisticated circuitry usually has been done by hand with a soldering iron. Attempts at mass production generally met with either poor quality connections or damage to the expensive integrated circuits and circuit boards.

A method which has had some success in meeting these problems is the application of the required heat to the leads on the integrated circuits with focused radiant energy. This allows multiple joints to be simultaneously soldered without physically touching the workpiece and without widespread heat dispersion. This is known as reflowing the connection because it is necessary to first have a solder coating on the leads and circuit board pads.

Even this method hasn't sufficiently dealt with all the problems. Most integrated circuits are used with some type of printed circuit board. Mounted on the board there may be 25 flat packs, usually with 400 connections, and there can be many more. Each connection involves bonding one lead of the flat pack to a contact pad on the surface of the board. There are many types of contact pads in a typical circuit board. Each type has its own particular heat sink characteristic. These range from an unattached pad to one which is part of a plated-through hole and connected to a ground plane sandwiched between the insulated layers of the board. The latter type has a relatively large heat sink capacity because of the greater mass of copper connected to it. Thus, to impart sufficient heat to properly solder the joint, substantially more heat input is required before the solder on the lead and pad will reflow and form a connection of high quality. The heat requirement for such a pad is in the range of 6 to 10 times that needed for an unattached pad. A printed circuit board will commonly have many of both kinds and several intermediate varieties besides.

Focused radiant energy has not previously been able to satisfactorily solder printed circuit boards with variable heat sink requirements. Either the high heat capacity joints would be improperly soldered or there would be such a heat buildup in the area of low-heat capacity pads that nearby circuitry could be and often was damaged.

SUMMARY OF THE INVENTION

The present invention solves these and other problems by utilizing a dual source of radiant energy. The heat is focused by cylindroidal elliptical reflectors so as to focus on many aligned contact points simultaneously. The leads are pressed against the contact pads by a fixture which assures proper positioning. The primary radiation source is focused on a row of leads thus positioned. The secondary radiation source is focused on the exact opposite side of the printed circuit board. Thus, the two areas of focus will be extremely narrow lines which are parallel in space and separated by the thickness of the printed circuit board.

The addition of the second heat source makes a radiant energy method feasible. The energy contributed to the circuit board, leads, and contact pads is additive. The two lamps together apply about the same amount of energy to the components as one single lamp would. Areas of very high heat concentration are eliminated because each lamp singly is contributing only part of the total and the areas of focus are somewhat separated.

When the focus is on a contact pad which is unattached or has only a surface connection the heat sink capacity is low. The primary lamp fulfills the heat requirements while the insulating material in the printed circuit board protects the components from heat generated on the opposite side of the board. The secondary source is essentially eliminated as a heat source for that pad.

Contact pads which have high heat sink capacities have some kind of connection to other components, usually including a plated-through hole connection to a ground plane or to the opposite side of the board. These require the most heat application for proper soldering. The secondary source acts to heat these connections from the bottom side and thus fill the heat sink. Substantially less of the energy from the primary source is drawn off and proper joints are made without the need for radiant energy levels so high as to endanger the heat sensitive components and circuit boards.

The heat sources are rigidly fixed in positions which provide for two permanent, parallel, lines of focus. The printed circuit board, with the flat packs set in position by a fixture, is then moved so that successive rows of leads fall within the focal line of the primary source. Insuring proper positioning can be done in any of several ways. A simple method is to provide detents on tracks over which the printed circuit board slides. These detents are so located that there will be a stop at a position when a row is in proper focus.

The foremost object of this invention is to provide a production system for economically joining the leads of electrical components to the printed circuit board contact pads without endangering the components worked upon.

It is a further object to avoid physically touching the workpieces so as to minimize the chance of contaminating components leads which in turn improves solder connections.

It is a further object to utilize radiant energy as a production tool without damaging heat sensitive components.

It is a further object to eliminate hand soldering so as to provide better quality joints through increased repeatability.

It is a further object to optimize the amount of energy applied to the system so as to provide only that necessary for satisfactory production.

It is a further object to lessen the need for thorough inspection of the joints made because of increased reliability.

Figure 2:
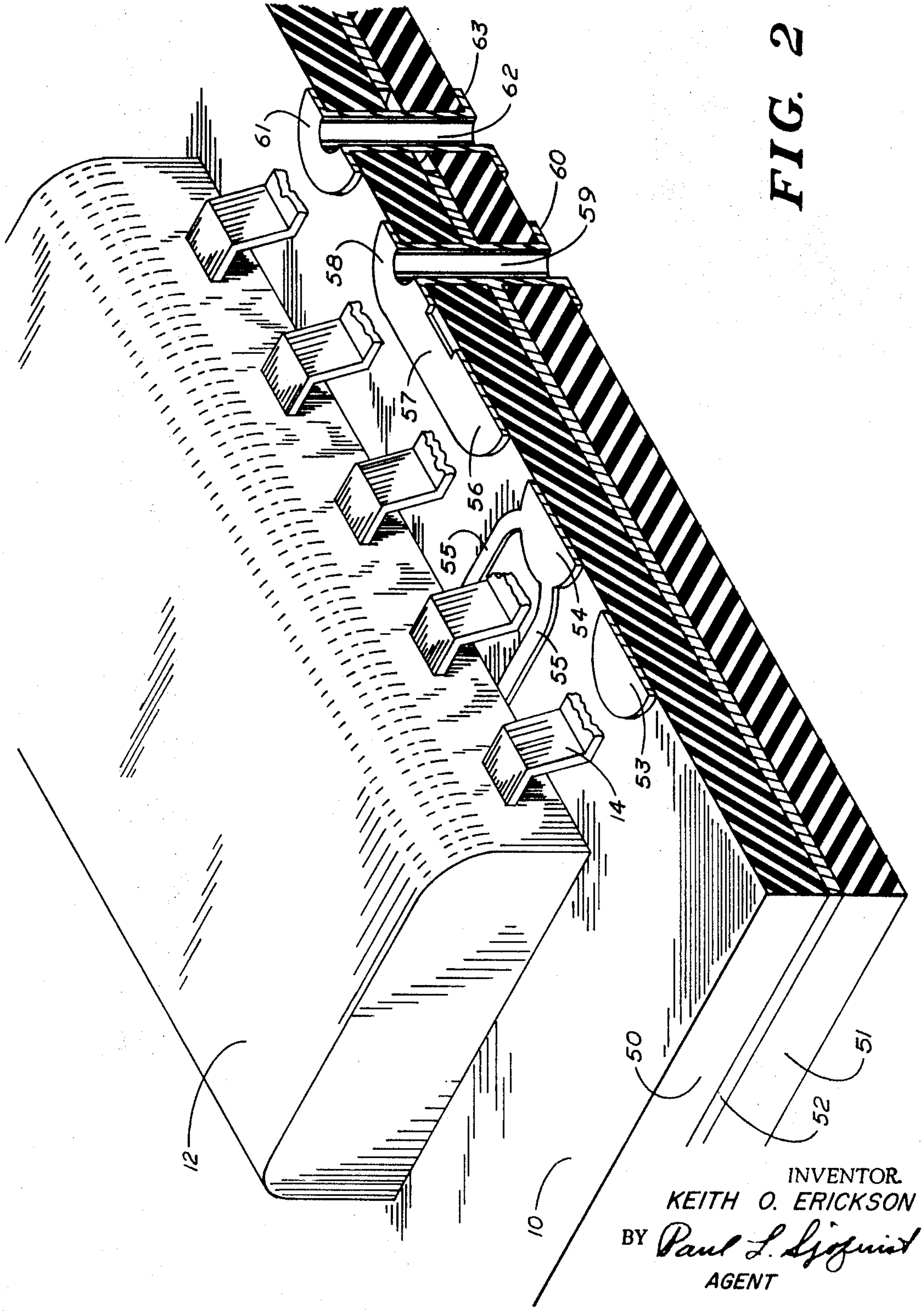
Figures 3, 4:
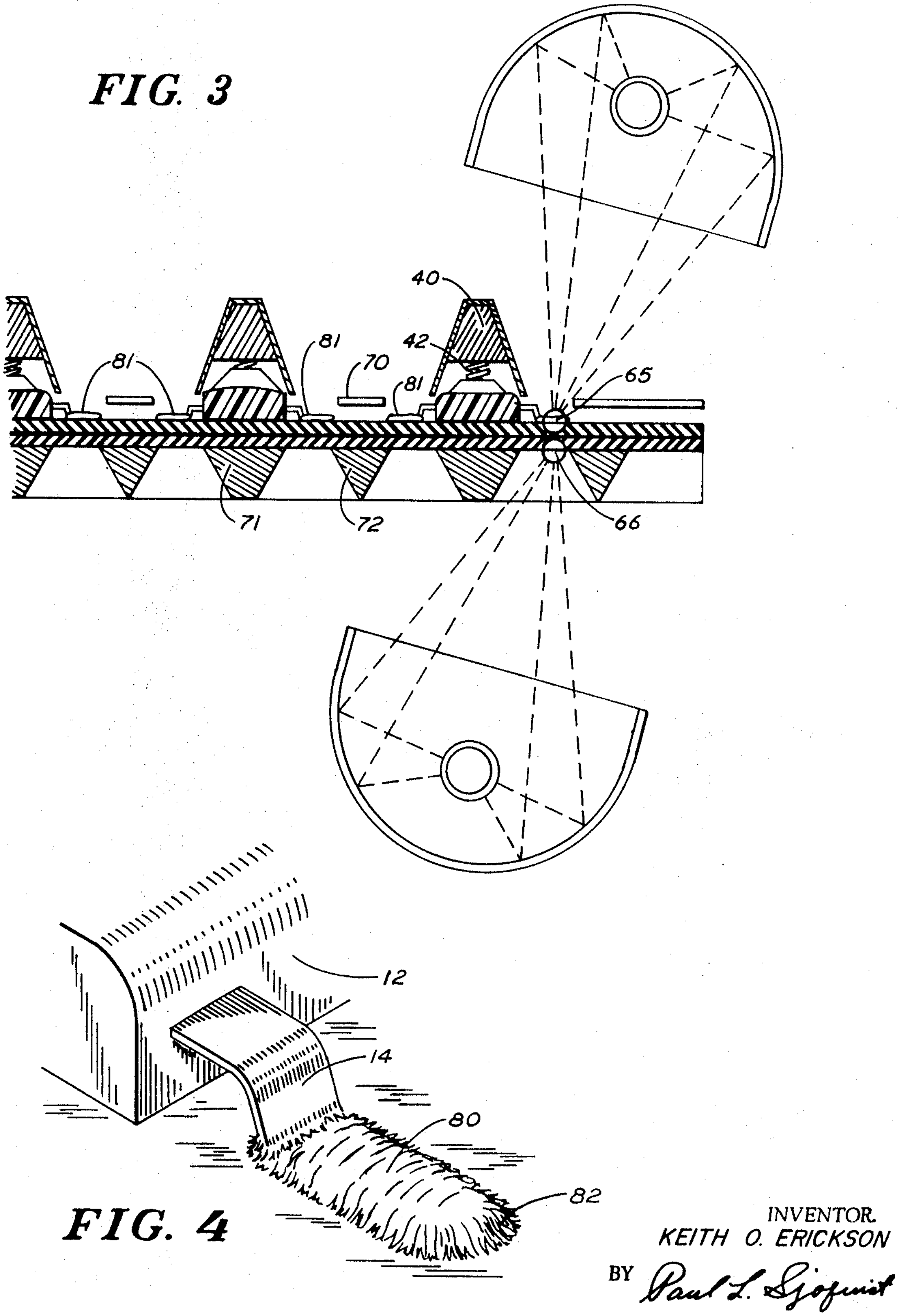

A more complete understanding of the invention may be had by reference to the following descriptions when taken in conjunction with the attached drawings, wherein:

FIG. 1 illustrates a perspective view of circuitry which is in position to utilize this invention; and FIG. 2 illustrates a section 2–2 of FIG. 1 of a printed circuit board with different types of contact pads; and FIG. 3 illustrates a section 3–3 of FIG. 1 of the radiant energy source as applied to the workpiece; and FIG. 4 illustrates a joint properly reflowed by this invention.

FIG. 1 illustrates generally a printed circuit board 10 upon which will be mounted a number of integrated circuit flat packs 12 each of which is attached to the printed circuit board at solder connection 15 between lead 14 and the pad 16 of the printed circuit board surface. This is done generally by focusing high-powered infrared lamp 24 at the interface between lead 14 and pad 16. Lamp 24 is focused by cylindroidal reflector 20. Simultaneously, infrared lamp 26 is focused along a line parallel to the line of focus of lamp 24 and separated only by the thickness of printed circuit board 10. Lamp 26 is focused by another cylindroidal reflector 22. The sum of the energies applied by lamps 24 and 26 will fuse the presoldered leads 14 to pads 16 without physically touching said leads or allowing excessive concentration of heat energy near electrical components. To solder subsequent rows of leads the printed circuit board is moved as a unit so that the various rows will be moved into the lines of focus of lamps 24 and 26. To do this the printed circuit board 10 is clamped to fixture 30. Board 10 and fixture 30 then are moved together along a slide 32 which contains detents 34. Detents 34 are so positioned that when a specific row of leads comes into focus the detent will stop and hold the printed circuit board in said focus by means of a stop 36 which is held in place by means of a spring 38. Fixture 30 also serves as a mechanism to clamp the flat packs 12 into their proper position with respect to the circuit board 10. Beams 40, which are a rigid part of fixture 30, support directly springs 42 which hold the flat packs 12 in a predetermined relationship with the pads 16 on printed circuit board 10. The beams and fixture arrangement serves yet another purpose. While heat is exceptionally well directed, the beams 40 serve as a further protecting device for the components by acting as a mounting point for heat shield 44. Thus, any lingering heat in the infrared lamps will shine upon the heat shields 44 rather than flat packs 12 when the printed circuit board 10 is moved along slide 32.

FIG. 2 is an illustration of some of the configurations of contact pads which may appear in a typical printed circuit board. This illustration also serves to point out the overall importance of the invention, as inspection of it yields an understanding of the many different kinds of contact pad configurations. This illustration is of a typical printed circuit board 10. The circuit board is made up of the upper insulating layer 50, lower insulating layer 51, and metallic ground plane 52 sandwiched by both of the insulating layers. The integrated circuit flat pack 12 is attached to printed circuit board 10 by reflowing the solder so that it will form both a physical and electrical connection between the contact pads and leads. Heat is applied to the presoldered leads so as to cause the solder to reflow the above-mentioned connection. The major problem in doing so is the fact that the amount of heat required to form a proper connection varies widely with the type of contact pad involved. If a uniform amount of heat was applied to all leads in a conventional way, one of two unsatisfactory results would be obtained. The contact pads such as pad 53 which have low heat sink requirements would be easily reflowed and the excess heat could travel through leads 14 into the flat pack and possibly damage the circuitry contained therein. Alternatively, those contact pads which have high heat sink characteristics might not be properly reflowed and there would be resulting poor quality either in terms of the electrical or the mechanical connection, or both. In the case of contact pad 53, there is no electrical connection at all to act as a heat sink. Its function is only as a mechanical connection and requires very little heat to properly reflow the solder. Contact pad 54 has only a slightly greater heat sink characteristic. Attached to the pad are a pair of surface foils 55 which act as a slight heat drain. Contact pad 56 represents a somewhat larger heat sink characteristic. Connected to contact pad 56 is wide surface foil 57 which is in turn connected to other metallic components which tend to absorb heat. This is a less severe problem than contact pad 58, to which it is electrically connected, because heat transfer takes time and is roughly proportional to the distance which heat has to travel. The heat sink elements of contact pad 58 are much more readily available to absorb the heat from the applied radiant energy. Draining the heat from contact pad 58 is wide surface foil 57 and its attached plated-through hole 59 which forms an electrical and a thermal connection with ground plane 52. Compared to the other elements involved, ground plane 52 is of enormous size and has extremely high heat capacity. This is by far the largest heat capacity element in the system and as a result the type of contact pad found in 58 requires substantially more heat energy to be applied than any other. Plated-through hole 59 also attaches to a contact pad 60 on the reverse side of the printed circuit board. This may in turn be attached to a wide or narrow foil or perhaps a power bus to further drain heat energy away from the workpiece. A somewhat less severe case is contact pad 61 which has no surface connections to draw off heat but has a plated-through hole 62 which differs from the previous one in that it does not make contact with ground plane 52. It is used to make an electrical circuit with contact pad 63 on the reverse side of the printed circuit board. The amount of heat to be absorbed in this particular situation is dependent upon the electrical connection which contact pad 63 makes on the reverse side of the circuit board. The main advantage of the present invention is that it provides heat distribution which is supplied to the surfaces of the printed circuit board in such a way that contact pads of widely varying heat sink characteristics will all receive a proper soldering operation without danger to adjacent components and in a rapid economical manner.

FIG. 3 is a detailed view of the particular setup used in a preferred embodiment to reflow the solder on the leads and the contact pads and form an electromechanical connection. Note the points of focus 65 and 66 as they appear in end view. Note also additional shielding 70 on the upper level, and shields 71 and 72 on the other side of the circuit board. These add additional protection to the heat shielding already described in FIG. 1. FIG. 3 and FIG. 4 also illustrate the difference between the leads before and after proper reflowing of the solder. Solder coatings 81 have not yet been reflowed by the radiant energy.

FIG. 4 shows a proper connection made by the reflow solder method and apparatus. Solder bead 80 is evenly distributed around the end of lead 14. There is a smooth and uniform fillet 82 of solder at the lead and printed circuit board pad interface.

It is to be understood that the method and apparatus in the above-described arrangement are simply illustrative of the principles of the invention. This invention has application in a wide range of activities in which it may be desirable to apply radiant energy to thermally sensitive material. Other arrangements may be devised by those skilled in the art which will embody the principles of the invention and fall within the spirit and scope thereof.

I claim:

1. A method of fusing a plurality of leads affixed to thermally sensitive electrical components to a plurality of contact pads on a printed circuit board, said contact pads having variable heat sink characteristics, comprising the steps of:

a. fixing said leads and said contact pads in abutting relationship;
b. positioning first and second radiation sources away from said leads and contact pads;
c. focusing said first radiation source on said leads such that the heat is applied to both the leads and adjacent contact pads;
d. focusing said second radiation source such that the focal point of said second radiation source is on that part of the surface of the circuit board directly opposite the focal point of said first radiation source;
e. activating said radiation sources such that the sum of the heat applied is sufficient to fuse said leads to the contact pads.

2. Apparatus for simultaneously connecting a plurality of thermally vulnerable electrical components with attached leads, to a printed circuit board which has linearly aligned electrical contact pads, said pads having variable heat sink characteristics, said apparatus comprising:

a. means for holding said leads in juxtaposed relationship with said contact pads;
b. a first radiation source;
c. means for focusing said first radiation source on a line passing through the interface between the contact pads and the aligned leads, so as to impart heat to both the leads and the contact pads;
d. a second radiation source; and
e. means for focusing said second radiation source on the reverse side of the printed circuit board, directly adjacent the line of focus for said first radiation source, such that heat is applied directly to said printed circuit board.

3. The apparatus of claim 2, in which said first and second radiation sources are infrared lamps.

4. The apparatus of claim 2, in which the means for focusing each of the radiation sources comprises an elliptically shaped cylindroidal reflector.